US010923482B2

(12) United States Patent
Bossu et al.

(10) Patent No.: US 10,923,482 B2
(45) Date of Patent: Feb. 16, 2021

(54) IC PRODUCT WITH A NOVEL BIT CELL DESIGN AND A MEMORY ARRAY COMPRISING SUCH BIT CELLS

(71) Applicant: GLOBALFOUNDRIES U.S. Inc., Santa Clara, CA (US)

(72) Inventors: Germain Bossu, Dresden (DE); Nigel Chan, Dresden (DE)

(73) Assignee: GLOBALFOUNDRIES U.S. Inc., Santa Clara, CA (US)

( * ) Notice: Subject to any disclaimer, the term of this patent is extended or adjusted under 35 U.S.C. 154(b) by 95 days.

(21) Appl. No.: 16/396,916

(22) Filed: Apr. 29, 2019

(65) Prior Publication Data

US 2020/0343248 A1 Oct. 29, 2020

(51) Int. Cl.
*H01L 27/11* (2006.01)
*H01L 27/02* (2006.01)
*H01L 29/08* (2006.01)

(52) U.S. Cl.
CPC ...... *H01L 27/1104* (2013.01); *H01L 27/0207* (2013.01); *H01L 29/0843* (2013.01)

(58) Field of Classification Search
CPC ............ H01L 27/1104; H01L 27/0207; H01L 29/0843; G11C 5/005; G11C 11/4125
USPC ...................................................... 257/903
See application file for complete search history.

(56) References Cited

U.S. PATENT DOCUMENTS

| 4,901,279 | A | * | 2/1990 | Plass | G11C 11/417 |
| | | | | | 257/E27.099 |
| 6,117,722 | A | | 9/2000 | Wuu et al. | |
| 6,975,041 | B2 | * | 12/2005 | Hirano | G11C 11/4125 |
| | | | | | 257/393 |
| 7,471,548 | B2 | | 12/2008 | Baiocco et al. | |
| 8,004,042 | B2 | | 8/2011 | Yang et al. | |
| 8,766,364 | B2 | | 7/2014 | Doornbos et al. | |
| 10,276,578 | B2 | * | 4/2019 | Chen | H01L 29/24 |
| 10,541,244 | B1 | * | 1/2020 | Chen | G11C 11/413 |
| 2017/0062438 | A1 | | 3/2017 | Moll et al. | |

OTHER PUBLICATIONS

Apostolidis et al., "Design and Simulation of 6T SRAM Cell Architecture in 32nm Technology," Journal of Engineering Science and Technology, 9:145-149, 2016.

* cited by examiner

*Primary Examiner* — Mark V Prenty
(74) *Attorney, Agent, or Firm* — Yee Tze Lim; Hoffman Warnick LLC

(57) ABSTRACT

Disclosed is an illustrative bit cell that includes a first inverter circuit that includes a first input node and a first output node and a second inverter circuit that includes a second input node and a second output node, wherein the first output node is coupled to the second input node and the second output node is coupled to the first input node. The bit cell also includes a first extension field effect transistor that includes a first gate structure, a first cell-internal S/D region and a first cell boundary node S/D region, wherein first cell-internal S/D region electrically terminates within the cell boundary. The first gate structure is electrically coupled to one of the first or second input nodes and it is also shorted to the first cell-internal S/D region.

15 Claims, 5 Drawing Sheets

IC PRODUCT WITH A NOVEL BIT CELL DESIGN AND A MEMORY ARRAY COMPRISING SUCH BIT CELLS

BACKGROUND

Field of the Disclosure

The present disclosure generally relates to the fabrication of semiconductor devices, and, more particularly, to various embodiments of an integrated circuit (IC) product with a novel bit cell design and a memory array including a plurality of such bit cells.

Description of the Related Art

In general, bit cell memory devices are the means by which electronic information is stored. There are many types of bit cell memory devices, e.g., SRAMs (Static Random Access Memory), DRAMs (Dynamic Random Access Memory), ROMs (Read Only Memory), etc., each of which has its own advantages and disadvantages relative to other types of memory devices. For example, SRAMs are typically employed in applications where higher speed and/or reduced power consumption is important, e.g., cache memory of a microprocessor, mobile phones and other mobile consumer products, etc. Millions of such memory devices are typically included in even very basic electronic consumer products. Irrespective of the type of memory device, there is a constant drive in the industry to increase the performance and durability of such memory devices. In typical operations, an electrical charge (HIGH) is stored in the memory device to represent a digital "1", while the absence of such an electrical charge or a relatively low charge (LOW) stored in the device indicates a digital "0". Read/write circuitry is used to access the memory device to store digital information on such a memory device and to determine whether or not a charge is presently stored in the memory device. These read/write cycles typically occur millions of times for a single memory device over its effective lifetime.

FIG. 1 depicts a typical prior art configuration of a 6T (six-transistor) SRAM memory cell 10 that includes two inverters—INV1 and INV2. In general, the SRAM cell 10 includes two NFET pass gate transistors PG1, PG2, two PFET pull-up transistors PU1, PU2, and two NFET pull-down transistors PD1, PD2. The source (S) and drain (D) regions of each of the transistors are also depicted in FIG. 1. Each of the PFET pull-up transistors PU1, PU2 has its gate (14A, 14B, respectively) connected to the gate (16A, 16B, respectively) of a corresponding NFET pull-down transistor PD1, PD2. The PFET pull-up transistors PU1, PU2 have their drain regions connected to the drain regions of the corresponding NFET pull-down transistors PD1, PD2. The PFET pull-up transistor PU1 and the NFET pull-down transistor PD1 define a first inverter INV1. The PFET pull-up transistor PU2 and the NFET pull-down transistor PD2 define a second inverter INV2. The net result is that the PFET pull-up transistor PU1 and the NFET pull-down transistor PD1 in the first inverter INV1 share a first common gate structure, while the PFET pull-up transistor PU2 and the NFET pull-down transistor PD2 in the second inverter INV2 share a second common gate structure. Additionally, the first inverter INV1 has an input node 21 and an output node 23. The second inverter INV2 has an input node 25 and an output node 27. As is standard, the first output node 23 is electrically coupled to the second input node 25 and the second output node 27 is electrically coupled to the first input node 21. That is, the first and second inverters are cross-coupled. The output nodes 23, 27 function as storage nodes for the cell.

The source regions of the PFET pull-up transistors PU1, PU2 are connected to a "high" potential, Vdd. The voltage level of Vdd may range from zero to +Vdd. The source regions of the NFET pull-down transistors PD1, PD2 are connected to a lower reference potential, typically Vss or ground. The main function of an inverter is to invert the input signal applied to its input, i.e., an inverter circuit outputs a voltage representing the opposite logic level to the voltage applied to its input. If the applied input voltage is logically low, then the output voltage becomes high and vice versa.

A first cross-coupling structure 17 connects the first common gate structure (shared by the PFET pull-up transistor PU1 and the NFET pull-down transistor PD1) in the first inverter to the drain region of the PFET pull-up transistor PU2 in the second inverter. Similarly, a second cross-coupling structure 18 connects the second common gate structure (shared by the PFET pull-up transistor PU2 and the NFET pull-down transistor PD2) in the second inverter to the drain region of the PFET pull-up transistor PU1 in the first inverter. The above-referenced cross-coupling contact structures may sometimes take the form of a conductive structure referred to within the industry as CAREC structures (CA Rectangular).

In operational terms, the potential present on the drain regions of the transistors PU1, PD1 (node 23) of the first inverter is applied to the gates of transistors PU2, PD2 of the second inverter and the charge serves to keep the second inverter in an ON or OFF state. The logically opposite potential is present on the drain regions of the transistors PU2, PD2 (node 27) of the second inverter and on the gates of the transistors PU1, PD1 of the first inverter, keeping the first inverter in the complementary OFF or ON state relative to the second inverter. Thus, the latch of the illustrated SRAM cell 10 has two stable states: a first state with a predefined potential present on charge storage node 23 and a low potential on charge storage node 27; and a second state with a low potential on charge storage node 23 and the predefined potential on charge storage node 27. Binary data are recorded by toggling between the two states of the latch. Sufficient charge must be stored on the charge storage node, and thus on the coupled gates of the associated inverter, to unambiguously hold one of the inverters "ON" and unambiguously hold the other of the inverters "OFF", thereby preserving the memory state. The stability of an SRAM cell 10 can be quantified by the margin by which the potential on the charge storage nodes can vary from its nominal value while still keeping the SRAM 10 cell in its original state.

Typically, the two PFET pull up transistors PU1, PU2 are formed on an isolated PFET active region defined in a semiconductor substrate. The isolated PFET active region is effectively shared by two adjacent cells in the memory array. Overall an SRAM array contains thousands of these isolated PFET active regions. Typically, the SRAM memory array may be configured so as to have two rows of these individual PFET active regions, wherein the rows are spaced apart from one another in the word line direction of the cell. Thus, there is typically a tip-to-tip (or end-to-end) spacing between these spaced-apart isolated PFET active regions within each of the rows, wherein the tip-to-tip space between the spaced-apart isolated PFET active regions is filled with an isolation material, e.g., silicon dioxide. Formation of these rows of spaced-apart PFET active regions can be problematic in that, given the very small tip-to-tip spacing between the individual spaced-apart PFET active regions within each row, the formation and positioning of the patterned etch mask used to pattern the substrate to initially define these individual spaced-apart PFET active regions must be relatively precise. Additionally, as these individual spaced-apart PFET active regions become physically smaller, in one or both of the bit-line direction and the word-line direction, the individual spaced-apart PFET active regions may exhibit an irregular configuration (when viewed from above) that is different from the idealized substantially rectangular pattern that is envisioned by the design process. Such variations in the configuration of the individual spaced-apart PFET active regions may impact the performance characteristics of the PFET transistor devices formed on such individual spaced-apart PFET active regions.

The present disclosure is directed to various embodiments of an IC product with a novel bit cell configuration and a memory array including a plurality of such bit cells that may promote scaling of bit cells and may reduce complexities in manufacturing bit cells.

SUMMARY

The following presents a simplified summary of illustrative embodiments of the invention in order to provide a basic understanding of some aspects of the illustrative embodiments of the invention. This summary is not an exhaustive overview of the illustrative embodiments of the invention specifically discussed herein. It is not intended to identify key or critical elements of the invention or to delineate the scope of the invention. Its sole purpose is to present some concepts in a simplified form as a prelude to the more detailed description that is discussed later.

Generally, the present disclosure is directed to various embodiments of an IC product with a novel bit cell configuration and a memory array including a plurality of such bit cells. One illustrative bit cell disclosed herein includes a first inverter circuit that includes a first input node and a first output node, both of which electrically terminate within the cell boundary of the bit cell, and a second inverter circuit that includes a second input node and a second output node, both of which electrically terminate within the cell boundary, wherein the first output node is coupled to the second input node and the second output node is coupled to the first input node. In this example, the bit cell also includes a first extension field effect transistor that includes a first gate structure, a first cell-internal source/drain region and a first cell boundary node source/drain region. The first cell-internal source/drain region electrically terminates within the cell boundary, the first gate structure is electrically coupled to one of the first or second input nodes and the first gate structure is shorted to the first cell-internal source/drain region.

One illustrative embodiment of a memory array disclosed herein includes first and second bit cells. The first bit cell has a cell boundary and includes first and second inverter circuits as well as a first extension field effect transistor. The first and second inverter circuits are operatively coupled to one another. The first extension field effect transistor includes a first gate structure, a first cell-internal source/drain region and a first cell boundary node source/drain region. The first gate structure of the first extension field effect transistor is electrically coupled to one of the first or second inverter circuits. In this example, the first gate structure is also shorted to the first cell-internal source/drain region and the first cell-internal source/drain region terminates within the cell boundary of the first bit cell. In this illustrative example, the second bit cell includes a cell boundary and third and fourth inverter circuits as well as a second extension field effect transistor. The third and fourth inverter circuits are operatively coupled to one another. The second extension field effect transistor includes a second gate structure, a second cell-internal source/drain region and a second cell boundary node source/drain region. The second gate structure of the second extension field effect transistor is electrically coupled to one of the third or fourth inverter circuits. In this example, the second gate structure is shorted to the second cell-internal source/drain region and the second cell-internal source/drain region terminates within the cell boundary of the second bit cell. In this example, the second cell boundary node source/drain region of the second extension field effect transistor is electrically coupled to the first cell boundary node source/drain region of the first extension field effect transistor.

BRIEF DESCRIPTION OF THE DRAWINGS

The disclosure may be understood by reference to the following description taken in conjunction with the accompanying drawings, in which like reference numerals identify like elements, and in which.

Figure 1:
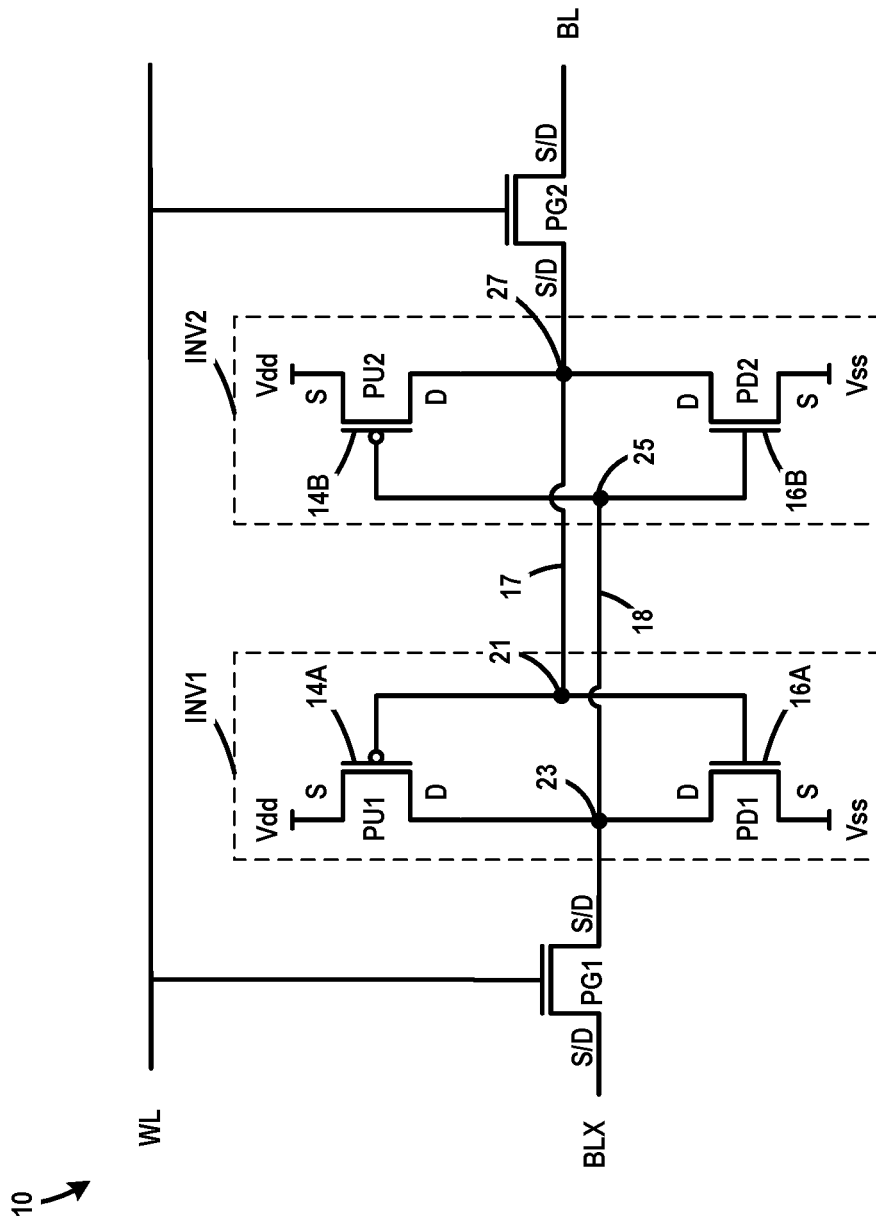
FIG. 1 is an electrical schematic of an illustrative prior art SRAM cell that includes two CMOS-based inverters.

While the subject matter disclosed herein is susceptible to various modifications and alternative forms, specific embodiments thereof have been shown by way of example in the drawings and are herein described in detail. It should be understood, however, that the description herein of specific and illustrative embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase. The various layers of material described below may be formed by any of a variety of different known techniques, e.g., a chemical vapor deposition (CVD) process, an atomic layer deposition (ALD) process, a thermal growth process, epitaxial growth processes, spin-coating techniques, etc. Moreover, as used herein and in the attached claims, the word "adjacent" is to be given a broad interpretation and should be interpreted to cover situations where one feature actually contacts another feature or is in close proximity to that other feature.

FIGS. 2-8 are various views that depict various embodiments of an IC product 100 with a novel bit cell 101 configuration, and various methods of making such a bit cell 101 and memory array 103 that comprises a plurality of the bit cells 101. In one illustrative example, the bit cell 101 may take the form of an SRAM cell. The IC product 100 is formed in and above a semiconductor substrate. The substrate may have a variety of configurations, such as a bulk substrate or a semiconductor-on-insulator (SOI) configuration. Such an SOI substrate includes a bulk semiconductor layer, a buried insulation layer positioned on the bulk semiconductor layer and an active semiconductor layer positioned on the buried insulation layer. The active layer and/or the base semiconductor layer may be made of silicon or they may be made of semiconductor materials other than silicon, and they both do not have to be made of the same semiconductor material. Thus, the terms "substrate" or "semiconductor substrate" should be understood to cover all semiconducting materials and all forms of such materials. The transistor devices disclosed herein will be formed in a plurality of active regions, e.g., a plurality of PFET active regions and a plurality of NFET active regions that may be formed in the bulk substrate or in the active layer of an SOI substrate.

Figure 2:
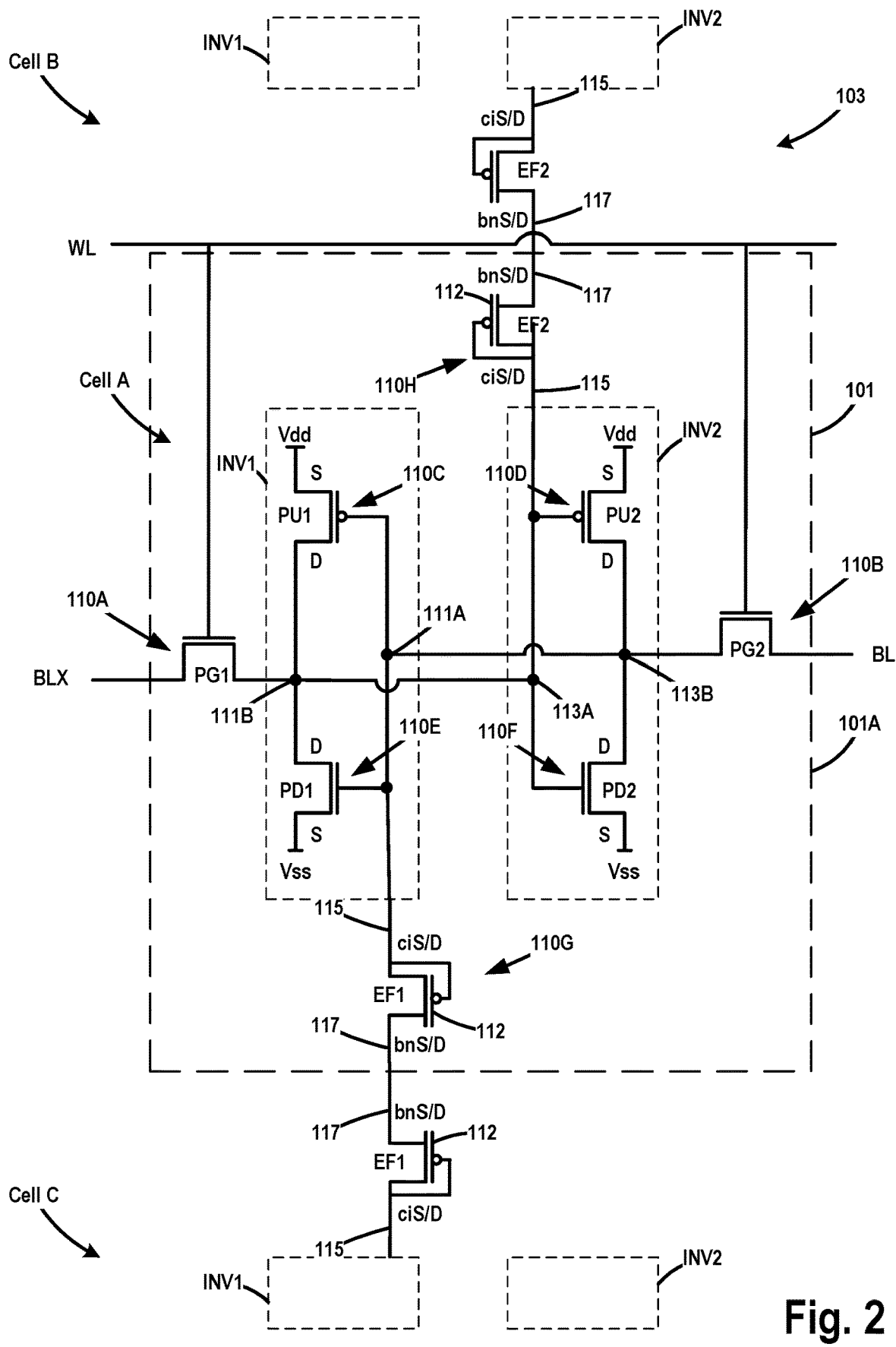
FIGS. 2-8 are various views that depict various embodiments of an IC product with a novel bit cell configuration and a memory array including a plurality of such bit cells.
Figure 3:
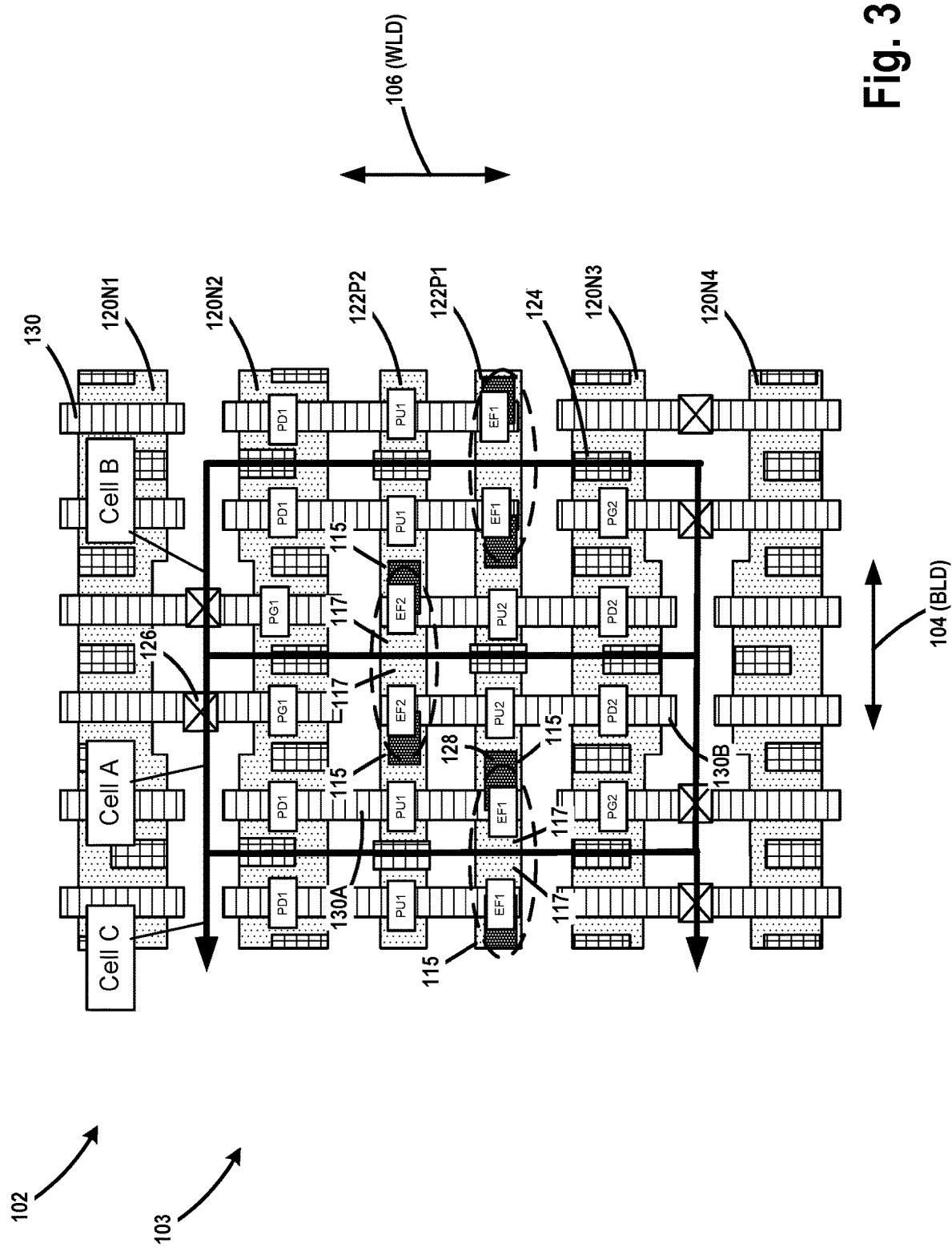

FIG. 2 is an electrical schematic of one illustrative embodiment of a novel bit cell 101 disclosed herein that is part of a memory array 103 formed on the IC product 100. In general, in one illustrative embodiment, the novel bit cell 101 comprises eight transistors that are configured so as to function as a six-transistor (6T) SRAM cell. The memory array 103 comprises a plurality, e.g., millions, of such bit cells 101. FIG. 2 depicts three illustrative bit cells 101 (Cell A, Cell B and Cell C) of such an array 103. FIG. 3 is a plan view of one illustrative configuration of a memory array 103 that includes a plurality of the bit cells 101—Cell A and Cell B—as well as a portion of Cell C. The bit-line direction (BLD) 104 and the word line direction (WLD) 106 of the memory array 103 (or cell 101) are indicated on at least some of the attached drawings.

In general, one illustrative embodiment of a novel bit cell 101 disclosed herein involves the formation of first and second extension field effect transistors, designated as EF1 and EF2 below. Each of the first and second extension field effect transistors is adapted to be electrically coupled to a corresponding extension field effect transistor positioned at a boundary of another bit cell positioned adjacent the bit cell 101. As will be appreciated by those skilled in the art after a complete reading of the present application, the extension field effect transistors disclosed herein may be either PFET devices or NFET devices. By way of example only, and not by way of limiting the scope of the inventions set forth in the appended claims, the present subject matter will be disclosed in the context of the illustrative example wherein the extension field effect transistors discussed herein are PFET devices. Accordingly, in this illustrative example, the extension field effect transistors may be referred to as PFET extension field effect transistors EF1 (110G), EF2 (110H), as described more fully below.

With reference to FIGS. 2 and 3, one illustrative embodiment of a novel bit cell 101 disclosed herein comprises two inverter circuits (INV1 and INV2) and the above-referenced two illustrative PFET extension field effect transistors EF1 (110G), EF2 (110H). More specifically, this illustrative example of a novel bit cell 101 comprises eight transistor devices 110A-110H (generally referenced using the numeral 110). In general, with reference to Cell A in FIGS. 2 and 3, one illustrative embodiment of the novel bit cell 101 includes two NFET pass gate transistors PG1 (110A), PG2 (110B), two PFET pull-up transistors PU1 (110C), PU2 (110D), two NFET pull-down transistors PD1 (110E), PD2 (110F) and the above-mentioned two illustrative PFET extension field effect transistors EF1 (110G), EF2 (110H). The boundary of the cell is depicted by the dashed line 101A in FIG. 2.

The transistors 110 depicted herein are intended to be representative in nature as it relates to the form or configuration of the transistors 110 as well as the manufacturing methods used to form the transistors 110. For example, the transistors 110 may be planar transistor devices, FinFET transistor devices, vertical transistor devices, etc., and they may be manufactured using known gate-first or replacement gate manufacturing techniques. Of course, in some embodiments, the bit cell 101 may include additional active circuit elements (e.g., various additional transistors included in 12T SRAM cells) and/or other passive circuit elements, e.g., capacitors, etc. In yet other embodiments, such a bit cell 101 may include the two illustrative PFET extension transistors EF1 (110G), EF2 (110H) and twelve additional transistor devices, e.g., a 12T SRAM cell. Thus, other than the two illustrative PFET extension transistors EF1, EF2, the number of other transistors within a particular bit cell 101, as well as the arrangement, configuration and connection of those other transistor devices among and between themselves within the bit cell 101, should not be considered to be a limitation to the present invention. As yet another example, the inventions disclosed herein may be employed in what is referred to within the industry as a "two-port" SRAM cell.

In the example depicted in FIGS. 2 and 3, the arrangement and connections of the NFET pass gate transistors 110A, 110B, the PFET pull-up transistors 110C, 110D and the NFET pull-down transistors 110E, 110F in the novel and illustrative bit cell 101 disclosed herein are the same as the arrangement and connections of the corresponding pass-gate transistors, pull-up transistors and pull-down transistors shown in the prior art SRAM cell 10 discussed in the background section of this application. Additionally, the first inverter (INV1) has an input node 111A and an output node 111B. The second inverter (INV2) has an input node 113A and an output node 113B. As is standard, the output node 111B of the first inverter is electrically coupled to the input node 113A of the second inverter, and the output node 113B of the second inverter is electrically coupled to the input node 111A of the first inverter. That is, the first and second inverters are cross-coupled. The output nodes 111B, 113B function as storage nodes for the bit cell 101.

The two illustrative PFET extension transistors EF1, EF2 have the same configuration. Each of the illustrative PFET extension transistors EF1, EF2 comprises a source region (S) and a drain region (D). One of the source/drain regions of the illustrative PFET extension transistors EF1, EF2 will terminate within the cell boundary 101A and may be referred to as a cell-internal source/drain region (ciSD) 115. The other source/drain region of the illustrative PFET extension transistors EF1, EF2 is a boundary node for the cell 101, and may be referred to as a boundary node source/drain region (bnSD) 117 of the illustrative PFET extension transistors EF1, EF2. Depending upon the particular application, the bit cell 101 may be configured such that the source region of the illustrative PFET extension transistors EF1, EF2 functions as either the cell-internal source/drain region 115 or the boundary node source/drain region 117. Similarly, depending upon the particular application, the bit cell 101 may be configured such that the drain region of the illustrative PFET extension transistors EF1, EF2 functions as either the cell-internal source/drain region 115 or the boundary node source/drain region 117. In the illustrative example depicted herein, the gate structure 112 of each of the illustrative PFET extension transistors EF1, EF2 will be electrically coupled to the cell-internal source/drain region 115 of the transistor. In the depicted example, the cell-internal source/drain region 115 of the PFET extension transistor EF1 is electrically coupled to the first inverter (INV1) in the bit cell 101, while the cell-internal source/drain region 115 of the PFET extension transistor EF2 is electrically coupled to the second inverter (INV2) in the bit cell 101. The cell boundary source/drain region 117 of each of the illustrative PFET extension transistors EF1, EF2 is adapted to be electrically coupled (directly or indirectly) to a cell boundary source/drain region 117 of an illustrative PFET extension transistor positioned in an adjacent bit cell. In one illustrative embodiment, the gate structures 112 of the illustrative PFET extension transistors EF1, EF2 may be electrically coupled to their respective cell-internal source/drain region 115 by a conductive structure of any shape, form or type, e.g., a CAREC structure. Additionally, in the depicted example, the gate structures 112 of the illustrative PFET extension transistors EF1, EF2, respectively, are electrically coupled to the gate structure of one or more of the transistors in the first and second inverters, respectively. More specifically, in the depicted example, the gate structures of the first pull-up transistor (PU1), the first pull-down transistor (PD1) and the first PFET extension transistor (EF1) are coupled to one another such that when the pass-gate transistor (PG2) of the second inverter is "ON", the voltage applied via bit line BL will be applied to the gate structures of each of the PU1, PD1 and EF1 transistors. Similarly, the gate structures of the second pull-up transistor (PU2), the second pull-down transistor (PD2) and the second PFET extension transistor (EF2) are coupled to one another such that when the pass-gate transistor (PG1) of the first inverter is "ON", the voltage applied via bit line BLX will be applied the gate structures of the each of the PU2, PD2 and EF2 transistors.

FIG. 2 also simplistically depicts additional memory cells of the memory array 103, i.e., Cell B (that is positioned above and adjacent Cell A) and Cell C (that is positioned below and adjacent Cell A). The first and second inverters are simply depicted as dashed-line regions in Cells B and C. As indicated therein, in this illustrative example, the first inverters (INV1) in Cells A and C are coupled to the illustrative PFET extension transistor EF1 in each of the cells, while the second inventers (INV2) in Cells A and B are coupled to the illustrative PFET extension transistors EF2 in each of the cells. Of course, other cell configurations are possible depending upon the particular details, configuration and components of the bit cells and the memory array.

As noted above, FIG. 3 is a plan view of a portion of one illustrative configuration of a memory array 103 which includes a plurality of illustrative bit cells 101—Cell A and Cell B are depicted within the heavy-line boxes. Only a portion of Cell C (discussed above) is shown in FIG. 3. Also depicted are a plurality of continuous NFET active regions 120N1, 120N2, 120N3 and 120N4 (collectively referenced using the designation 120N) and a plurality of continuous PFET active regions 122P1 and 122P2 (collectively referenced using the designation 122P). All of the continuous active regions are electrically isolated from one another. The continuous PFET active regions 122P1 and 122P2 are spaced apart from one another in the word line direction 106.

The NFET active regions 120 and the continuous PFET active regions 122 may be formed by forming a patterned etch mask above the substrate 102, performing one or more etching processes through the patterned etch mask so as to form trenches in the substrate 102 that define the active regions 120N, 122P in the substrate 102 and thereafter filling the trenches with an insulating material, e.g., silicon dioxide. As will be appreciated by those skilled in the art, in some embodiments, the NFET active regions 120N may comprise P-type dopants while the PFET active regions 122P may comprise N-type dopants.

In the depicted example, each of the memory cells A, B and C include a portion of the NFET active regions 120N2 and 120N3 as well as a portion of each of the continuous PFET active regions 122P1 and 122P2. Also note that the continuous PFET active regions 122P extend across the entire width of the memory cells A, B and C in the bit line direction 104 of the memory array 103. In the depicted example, the illustrative PFET extension transistors EF1 and the PFET pull-up transistors PU2 are formed on the continuous PFET active region 122P1, while the illustrative PFET extension transistors EF2 and the PFET pull-up transistors PU1 are formed on the PFET active region 122P2. The reverse configuration is, of course, possible.

Also depicted in FIG. 3 are various additional structures that are part of the memory array 103. For example, FIG. 3 depicts illustrative and representative conductive source/drain contact structures 124, e.g., trench silicide structures, gate contact structures 126, various CAREC contact structures 128 (for coupling the gate of the illustrative PFET extension transistors EF1, EF2 to their respective drain regions) and various gate structures 130 for the various transistor devices. The shared gate structure 130A for the PU1, PD1 and EF1 transistors, as well as the shared gate structure 130B for the PU2, PD2 and EF2 transistors are also shown in FIG. 3. The structure, configuration, materials of construction and manner of making these various additional structures are well known to those skilled in the art. Of course, not all details and aspects of a real-world bit cell 101 or a real-world memory array 103 are depicted in the attached drawings so as not to overly complicate the present disclosure and because such details are well known to those skilled in the art.

Figure 4:
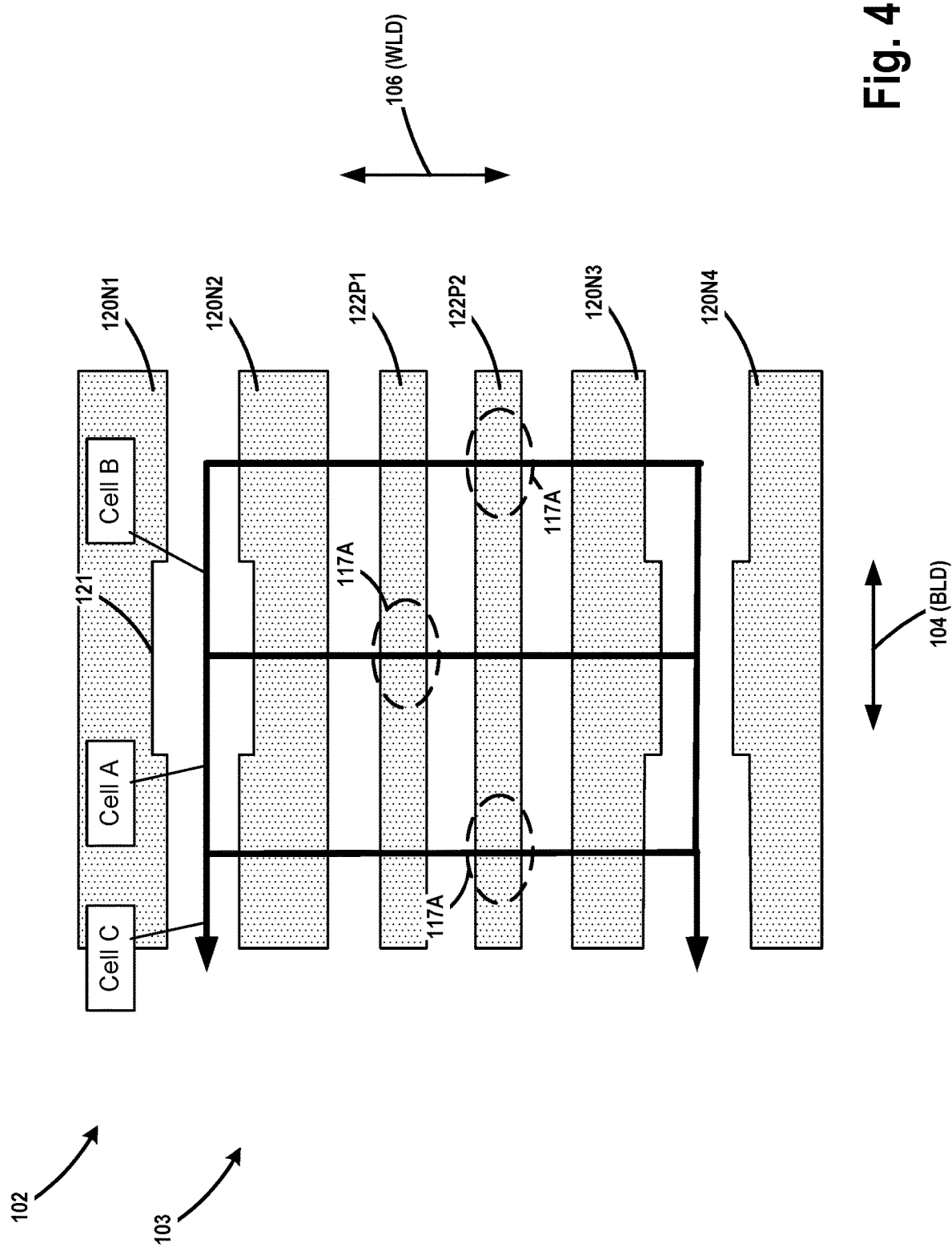

FIG. 4 is a copy of FIG. 3 showing the plurality of continuous NFET active regions 120N and the plurality of the continuous PFET active regions 122P at a point in time where the regions 120N and 122P have been defined in the substrate 102, and isolation material (not shown), e.g., silicon dioxide, has been formed in the trenches that define the active regions 120N, 122P. The location of what will become the bit cells A, B and C is also depicted in FIG. 4. As used herein and in the attached claims, the description of the PFET active regions 122P as being "continuous" means that the PFET active regions 122P extend uninterrupted across the entirety of the bit cell—e.g., across the entirety of each of the cells A, B in C, in the bit line direction 104 of the memory array 103. More specifically, with reference to FIG. 4, there is an absence of an isolation structure (at, for example, the region 117A depicted in dashed lines) that would effectively cut what would otherwise be a continuous PFET active region into multiple individual spaced-apart active PFET regions that are spaced in an end-to-end relationship with a tip-to-tip spacing between such individual spaced-apart active PFET regions. Such a bit cell 101 that comprises continuous PFET active regions 122 is in contrast to the individual, separate spaced-apart islands of PFET active regions (with tip-to tip spacing between these individual, separate spaced-apart islands of PFET active regions) as was used in the prior art SRAM cell discussed in the background section of this application.

Importantly, in one particular example, the inclusion of the illustrative PFET extension transistors EF1, EF2 in each of the bit cells 101 permits the formation of the continuous PFET active regions 122P across the entire dimension of the bit cells 101 in the bit line direction 104 of the memory array 103. The continuous PFET active regions 122P have a relatively simple, continuous line-type configuration as opposed to the individual, separate spaced-apart islands of PFET active regions (with tip-to tip spacing between these individual, separate spaced-apart islands of PFET active regions) as was used in the prior art SRAM cell discussed in the background section of this application. It should also be noted that describing the continuous PFET active regions 122P as "line-type" features does not mean to imply that these continuous PFET active regions 122P are required to have a precise rectangular configuration when viewed from above, although such a substantially rectangular configuration may be present in some applications. For example, the continuous NFET regions 120 depicted in FIGS. 3 and 4 should also be considered to be "line-type" active regions even though, in this particular example, the continuous NFET regions 120 have a configuration when viewed form above that is not a pure rectangular configuration due to the presence of the notched area 121 in the continuous NFET regions 120. The notched area 121 is formed in the continuous NFET regions 120 for a variety of purposes that are unrelated to the present subject matter. Accordingly, even if the continuous PFET active regions 122P deviate from an approximate rectangular configuration when viewed from above (like the NEFT regions 120N), such continuous PFET active regions 122P should still be considered to have a line-type configuration as long as the PFET active regions 122P are continuous and extend uninterrupted in the bit line direction 104 with the bit cell 101.

The formation of a memory array 103 with the continuous PFET active regions 122P disclosed herein (with the line-type configuration) is a simpler patterning process as opposed to the formation of the rows of separate spaced-apart isolated PFET active regions in prior art SRAM arrays. Moreover, the formation of the continuous PFET active regions 122P disclosed herein in a memory array may help achieve further scaling of such memory arrays. At this point of processing in FIG. 3, traditional manufacturing operations may be performed to complete the fabrication of the IC product 100. For example, additional read-write circuitry (not shown—but the structure and function of which is known to those skilled in the art) may be formed for purposes of communication with the bit cells 101 within the memory array 103. Additionally, various metallization layers may be formed above the product 100 using techniques that are well known to those skilled in the art.

In terms of static conditions, FIG. 5-8 depict the four possible static conditions between the illustrative PFET extension transistors that communicate between adjacent cells, e.g., the extension transistor EF1 in Cell A and the extension transistor EF1 in Cell C. Of course, the relationship will be the same for the shared PFET extension transistors EF2 between Cells A and B. As indicated in these figures, the boundary node source/drain region (bnSD) 117 of the illustrative PFET extension transistor EF1 in cell A is electrically coupled (directly or indirectly) to the boundary node source/drain region (bnSD) 117 of the illustrative PFET extension transistor EF1 in cell C at node 127. As noted above, depending upon the configuration of the bit cell 101 and the connection of various devices within the bit cell 101, the boundary node source/drain region (bnSD) 117 of one or both of the two illustrative PFET extension transistors EF1 depicted in FIGS. 5-8 may be the source region or the drain region of such PFET extension transistors EF1. As also noted above, the cell-internal source/drain region (ciSD) 115 of each of the illustrative PFET extension transistors EF1 will be conductively coupled (i.e., shorted) to their respective gate structures 112.

Figure 5:
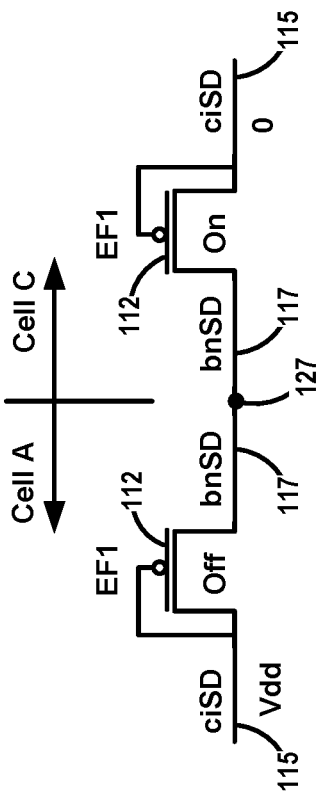

FIG. 5 depicts the static condition where a logically low voltage level, e.g., zero, is applied to the gate structure 112 and cell-internal source/drain region 115 of the extension transistor EF1 in Cell A and a logically high voltage level, e.g., +Vdd, is applied to the gate structure 112 and cell-internal source/drain region 115 of the extension transistor EF1 in Cell C. As a result, the extension transistor EF1 in Cell A is turned "ON", but the extension transistor EF1 in Cell C is turned "OFF." In this condition, a SPICE simulation reflects that, for a Vdd level of about 800 mV, the leakage current through the extension transistors EF1 may be relatively small relative to the leakage current for the overall bit cell 101, e.g., there may be a leakage current of less than 5% through the extension transistors EF1 under the static condition shown in FIG. 5.

Figure 6:
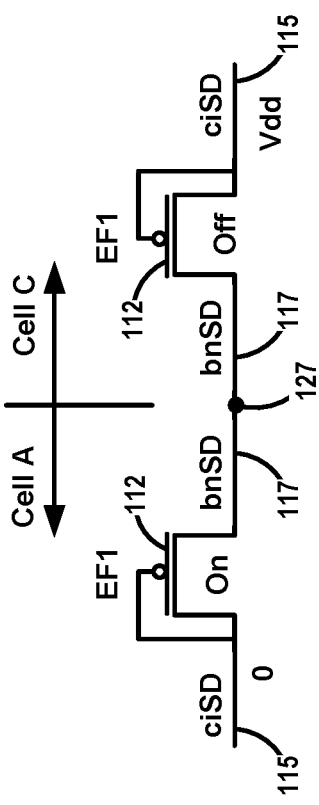

FIG. 6 depicts a static condition that is opposite to the static condition shown in FIG. 5. That is, FIG. 6 depicts the static condition where a logically low voltage level, e.g., zero, is applied to the gate structure 112 and the cell-internal source/drain region 115 of the extension transistor EF1 in Cell C and a logically high voltage level, e.g., +Vdd, is applied to the gate structure 112 and the cell-internal source/drain region 115 of the extension transistor EF1 in Cell A. As a result, the extension transistor EF1 in cell A is turned "OFF", but the extension transistor EF1 in Cell C is turned "ON". It is similar to the static condition depicted in FIG. 5, except for the inversing of the voltages applied to the cell-internal source/drain regions 115. As a result, all comments related to FIG. 5 apply as well to the configuration shown in FIG. 6.

Figure 7:
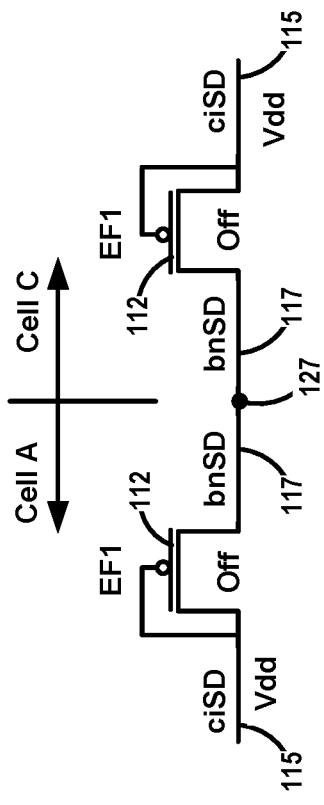

FIG. 7 depicts the static condition where a logically low voltage level, e.g., zero, is applied to the gate structure 112 and cell-internal source/drain region 115 of the extension transistor EF1 in Cell A and the logically low voltage level, e.g., zero, is also applied to the gate structure 112 and cell-internal source/drain region 115 of the extension transistor EF1 in Cell C. Since the node 127 is only connected to the two EF1 and EF2 transistors and they both have 0V applied on their respective cell-internal source/drain regions 115, the node 127 can only sit statically to 0V, thereby turning off the EF1 and EF2 transistors.

Figure 8:
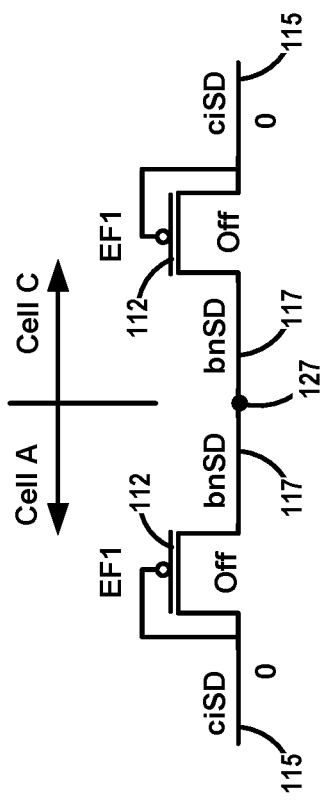

FIG. 8 depicts the static condition where a logically high voltage level, e.g., +Vdd, is applied to the gate structure 112 and cell-internal source/drain region 115 of the extension transistor EF1 in Cell A and a logically high voltage level, e.g., +Vdd, is also applied to the gate structure 112 and the cell-internal source/drain region 115 of the extension transistor EF1 in Cell C. As a result, the extension transistor EF1 in Cell A is turned "OFF" and the extension transistor EF1 in Cell C is turned "OFF", thereby preventing any appreciable current flow between the bit cells A and B. Additionally, in terms of leakage currents under static conditions, the inclusion of the two illustrative PFET extension transistors EF1, EF2 in the novel bit cell 101 disclosed herein is believed to have limited to no appreciable impact on the overall leakage currents of the bit cell 101.

Of course, read and write operations must be performed on the bit cell 101 for it to serve its intended purpose. The read and write operations are transient or dynamic in nature. The following discussion is directed to the embodiment where the bit cell 101 is an SRAM cell. Performing such read and write operations on SRAM Cell A may disturb its neighboring SRAM Cell B and its neighboring SRAM Cell C. However, based upon SPICE simulations, the disturbance on the neighboring SRAM Cells B and C during read/write operations performed on Cell A is believed to be minimal and within acceptable limits. The following is based upon a SPICE simulation wherein the value of Vdd for the bit cell 101 was about 800 mV. Of course, this is simply an illustrative example as the present invention should not be considered to be limited to any particular form of a bit cell 101 or any absolute operational parameters of such a bit cell 101.

As noted above, when performing a read operation on SRAM Cell A, the state on Cell A was maintained while the disturbance on SRAM Cell B (via communication between the two PFET extension transistors EF2 during the read operation) was at most about 1 mV, and the disturbance on SRAM Cell C (via communication between the two PFET extension transistors EF1 during the read operation) was also at most about 1 mV.

Similarly, when performing a write operation on SRAM Cell A (both writing from 0 to 1 and from 1 to 0), the disturbance on SRAM Cell B (via communication between the two PFET extension transistors EF2 during the write operation) ranged between about −4 mV to about 1.2 mV, while the disturbance on SRAM Cell C (via communication between the two PFET extension transistors EF1 during the write operation) ranged from about −3 mV to about 8 mV. Thus, the SPICE simulation indicates that any disturbance of the adjacent SRAM cells when reading or writing to the SRAM Cell A is believed to be minimal and within acceptable limits in terms of the overall operation of the bit cell 101.

As will be appreciated by those skilled in the art after a complete reading of the present application, there are several novel embodiments of various bit cells and memory arrays disclosed herein. In one example, a bit cell 101 disclosed herein includes a first inverter circuit INV1 that comprises a first input node and a first output node, both of which electrically terminate within the cell boundary 101A of the cell 101, and a second inverter circuit INV2 that includes a second input node and a second output node, both of which electrically terminate within the cell boundary 101A, wherein the first output node is coupled to the second input node and the second output node is coupled to the first input node. In this example, the bit cell 101 also includes a first extension field effect transistor that includes a first gate structure 112, a first cell-internal source/drain region 115 and a first cell boundary node source/drain region 117, wherein the first cell-internal source/drain region 115 electrically terminates within the cell boundary 101A. The first gate structure 112 is electrically coupled to one of the first or second input nodes and the first gate structure 112 is also shorted to the first cell-internal source/drain region 115. In further embodiments, the bit cell 101 may include a second extension field effect transistor positioned within the cell boundary 101A. The second extension field effect transistor includes a second gate structure 112, a second cell-internal source/drain region 115 and a second cell boundary node source/drain region 117, wherein the second cell-internal source/drain region 115 electrically terminates within the cell boundary 101A. The second gate structure 112 is electrically coupled to the other of the first or second input nodes that is not coupled to the first gate structure 112 of the first extension field effect transistor, and the second gate structure 112 is shorted to the second cell-internal source/drain region 115 of the second extension field effect transistor. In yet further embodiments, the first extension field effect transistor is a first PFET extension transistor and the second extension field effect transistor is also a second PFET extension transistor.

In yet another example, when first and second extension field effect transistor devices are PFET devices, the bit cell may include a first continuous PFET active region that extends across an entirety of the bit cell in the bit line direction, wherein the first PFET extension transistor and the second PFET extension transistor are formed on the first continuous PFET active region. In yet further embodiments, the bit cell may include a second continuous PFET active region that extends across an entirety of the bit cell in the bit line direction, and a plurality of additional PFET transistors wherein all of the first PFET extension transistor, the second PFET extension transistor and the plurality of additional PFET transistors, when considered collectively, are formed on the first continuous PFET active region and the second continuous PFET active region, when the first continuous PFET active region and the second continuous PFET active region are considered collectively. In yet further embodiments, the bit cell may include a group of NFET transistors, a first continuous NFET active region and a second continuous NFET active region. In this further embodiment, when considered collectively, all of the NFET transistors in the group of NFET transistors are formed on the first continuous NFET active region and the second continuous NFET active region, when the first continuous NFET active region and the second continuous NFET active region are considered collectively.

In another example, a memory array 103 disclosed herein includes a first bit cell having a cell boundary, wherein the first bit cell includes first and second inverter circuits as well as a first extension field effect transistor. The first extension field effect transistor includes a first gate structure 112, a first cell-internal source/drain region 115 and a first cell boundary node source/drain region 117, wherein the first gate structure 112 of the first extension field effect transistor is electrically coupled to one of the first or second inverter circuits. In this example, the first gate structure 112 is shorted to the first cell-internal source/drain region 115 and the first cell-internal source/drain region 115 terminates within the cell boundary of the first bit cell. This illustrative example of the memory array 103 also includes a second bit cell having a cell boundary, wherein the second bit cell includes third and fourth inverter circuits as well as a second extension field effect transistor. The second extension field effect transistor includes a second gate structure 112, a second cell-internal source/drain region 115 and a second cell boundary node source/drain region 117, wherein the second gate structure 112 of the second extension field effect transistor is electrically coupled to one of the third or fourth inverter circuits. In this example, the second gate structure 112 is shorted to the second cell-internal source/drain region 115 and the second cell-internal source/drain region 115 terminates within the cell boundary of the second bit cell. In this example, the second cell boundary node source/drain region 117 of the second extension field effect transistor is electrically coupled to the first cell boundary node source/drain region 117 of the first extension field effect transistor.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

The invention claimed is:

1. A bit cell of a memory array, the bit cell comprising a cell boundary, the memory array having a word line direction and a bit line direction, the bit cell comprising:
a first inverter circuit comprising a first input node and a first output node, both of which electrically terminate within the cell boundary;
a second inverter circuit comprising a second input node and a second output node, both of which electrically terminate within the cell boundary, wherein the first output node is coupled to the second input node and the second output node is coupled to the first input node; and
a first extension field effect transistor comprising a first gate structure, a first cell-internal source/drain region and a first cell boundary node source/drain region, wherein the first cell-internal source/drain region electrically terminates within the cell boundary, wherein the first gate structure is electrically coupled to one of the first or second input nodes and wherein the first gate structure is shorted to the first cell-internal source/drain region.

2. The bit cell of claim 1, further comprising a second extension field effect transistor positioned within the cell boundary, the second extension field effect transistor comprising a second gate structure, a second cell-internal source/drain region and a second cell boundary node source/drain region, wherein the second cell-internal source/drain region electrically terminates within the cell boundary, wherein the second gate structure is electrically coupled to the other of the first or second input nodes that is not coupled to the first gate structure, and wherein the second gate structure is shorted to the second cell-internal source/drain region.

3. The bit cell of claim 1, wherein the first cell-internal source/drain region is a drain region of the first extension field effect transistor and wherein the bit cell is an SRAM cell.

4. The bit cell of claim 2, wherein the first extension field effect transistor is a first PFET extension transistor and the second extension field effect transistor is a second PFET extension transistor.

5. The bit cell of claim 4, further comprising a first continuous PFET active region that extends across an entirety of the bit cell in the bit line direction, wherein the first PFET extension transistor and the second PFET extension transistor are formed on the first continuous PFET active region.

6. The bit cell of claim 5, further comprising:
a second continuous PFET active region that extends across an entirety of the bit cell in the bit line direction, wherein the first and second continuous PFET active regions are isolated from one another; and
a plurality of additional PFET transistors, wherein all of the first PFET extension transistor, the second PFET extension transistor and the plurality of additional PFET transistors, when considered collectively, are formed on the first continuous PFET active region and the second continuous PFET active region, when the first continuous PFET active region and the second continuous PFET active region are considered collectively.

7. The bit cell of claim 6, wherein the plurality of additional PFET transistors consists of a first pull-up PFET transistor and a second pull-up PFET transistor, wherein the first PFET extension transistor and the second PFET pull-up transistor are formed on the first continuous PFET active region and wherein the second PFET extension transistor and the first PFET pull-up transistor are formed on the second continuous PFET active region.

8. The bit cell of claim 6, further comprising:
a group of NFET transistors;
a first continuous NFET active region; and
a second continuous NFET active region that is isolated from the first continuous NFET active region, wherein each of the first and second continuous NFET active regions extend across an entirety of the bit cell in the bit line direction and wherein, when considered collectively, all of the NFET transistors in the group of NFET transistors are formed on the first continuous NFET active region and the second continuous NFET active region, when the first continuous NFET active region and the second continuous NFET active region are considered collectively.

9. The bit cell of claim 8, wherein the first PFET extension transistor, the second PFET extension transistor and the plurality of additional PFET transistors, considered collectively, constitute a total of four PFET transistors and wherein the group of NFET transistors consists of four NFET transistors.

10. The bit cell of claim 1, wherein the first cell boundary node source/drain region of the first extension field effect transistor is adapted to be electrically coupled to a cell boundary node source/drain region of a third extension field effect transistor positioned in a second bit cell positioned adjacent the bit cell.

11. A memory array, the memory array having a word line direction and a bit line direction, the memory array, comprising:
a first bit cell having a cell boundary, the first bit cell comprising;

a first inverter circuit;

a second inverter circuit that is operatively coupled to the first inverter circuit; and a first extension field effect transistor comprising a first gate structure, a first cell-internal source/drain region and a first cell boundary node source/drain region, wherein the first gate structure is electrically coupled to one of the first or second inverter circuits, wherein the first gate structure is shorted to the first cell-internal source/drain region and wherein the first cell-internal source/drain region terminates within the cell boundary of the first bit cell; and a second bit cell having a cell boundary, the second bit cell comprising;

a third inverter circuit;

a fourth inverter circuit that is operatively coupled to the third inverter circuit; and a second extension field effect transistor comprising a second gate structure, a second cell-internal source/drain region and a second cell boundary node source/drain region, wherein the second gate structure is electrically coupled to one of the third or fourth inverter circuits, wherein the second gate structure is shorted to the second cell-internal source/drain region, wherein the second cell-internal source/drain region terminates within the cell boundary of the second bit cell, and wherein the second cell boundary node source/drain region of the second extension field effect transistor is electrically coupled to the first cell boundary node source/drain region of the first extension field effect transistor.

12. The memory array of claim 11 further comprising:

a third extension field effect transistor positioned within the first bit cell, the third extension field effect transistor comprising a third gate structure, a third cell-internal source/drain region and a third cell boundary node source/drain region, wherein the third gate structure is electrically coupled to one of the first or second inverter circuits, wherein the third gate structure is shorted to the third cell-internal source/drain region and wherein the third cell-internal source/drain region terminates within the cell boundary of the first bit cell; and a fourth extension field effect transistor positioned within the second bit cell, the fourth extension field effect transistor comprising a fourth gate structure, a fourth cell-internal source/drain region and a fourth cell boundary node source/drain region, wherein the fourth gate structure is electrically coupled to one of the third or fourth inverter circuits, wherein the fourth gate structure is shorted to the fourth cell-internal source/drain region, wherein the fourth cell-internal source/drain region terminates within the cell boundary of the second bit cell, and wherein the fourth cell boundary node source/drain region of the fourth extension field effect transistor is electrically coupled to the third cell boundary node source/drain region of the third extension field effect transistor.

13. The memory array of claim 12, wherein the first extension field effect transistor is a first PFET extension transistor, the second extension field effect transistor is a second PFET extension transistor, the third extension field effect transistor is a third PFET extension transistor and the fourth extension field effect transistor is a fourth PFET extension transistor.

14. The memory array of claim 13, further comprising:

a first continuous PFET active region that extends across an entirety of the first bit cell and the second bit cell in the bit line direction: and a second continuous PFET active region that extends across an entirety of the first bit cell and the second bit cell in the bit line direction, wherein the first and second continuous active regions are isolated from one another, wherein the first and second PFET extension transistors are formed on the first continuous PFET active region and wherein the third and fourth PFET extension transistors are formed on the second continuous PFET active region.

15. The memory array of claim 14, further comprising a plurality of additional PFET transistors positioned in the first bit cell wherein all of the first PFET extension transistor, the third PFET extension transistor and the plurality of additional PFET transistors, when considered collectively, are formed on the first continuous PFET active region and the second continuous PFET active region, when the first continuous PFET active region and the second continuous PFET active region are considered collectively.

\* \* \* \* \*